(12) United States Patent
Huang

(10) Patent No.: US 6,466,146 B1
(45) Date of Patent: *Oct. 15, 2002

(54) HYBRID LOW-PASS SIGMA-DELTA MODULATOR

(75) Inventor: Renyuan Huang, Salt Lake City, UT (US)

(73) Assignee: Sonic Innovations, Inc., Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/703,501

(22) Filed: Oct. 31, 2000

Related U.S. Application Data

(63) Continuation of application No. 09/286,261, filed on Apr. 5, 1999, now Pat. No. 6,163,287.

(51) Int. Cl.[7] .................................................. H03M 3/00
(52) U.S. Cl. ...................... 341/143; 341/172; 327/554; 333/173
(58) Field of Search ................................. 341/143, 172; 327/337, 554, 558; 333/173

(56) References Cited

U.S. PATENT DOCUMENTS

| | | | |
|---|---|---|---|
| 3,234,544 A | 2/1966 | Marenholtz | 340/347 |
| 3,298,019 A | 1/1967 | Nossen | 340/347 |
| 3,509,557 A | 4/1970 | Groth | 340/347 |
| 3,582,947 A | 6/1971 | Harrison | 340/347 |
| 3,678,501 A | 7/1972 | Prill | 340/347 |
| 3,750,142 A | 7/1973 | Barnes et al. | 340/347 |
| 4,114,149 A | 9/1978 | Kendall | 340/347 |
| 4,210,903 A | 7/1980 | LaBrie | 340/347 |
| 4,243,974 A | 1/1981 | Mack | 340/347 |
| 4,291,300 A | 9/1981 | Bader | 340/347 |
| 4,590,459 A | 5/1986 | Lanz et al. | 340/347 |
| 4,685,042 A | 8/1987 | Severinsky | 363/41 |
| 4,739,305 A | 4/1988 | Naito | 340/347 |
| 5,014,013 A | 5/1991 | Kotzian | 328/145 |
| 5,014,016 A | 5/1991 | Anderson | 330/10 |
| 5,027,306 A | 6/1991 | Dattorro et al. | 364/724.1 |
| 5,059,981 A | 10/1991 | Hauser | 341/164 |
| 5,103,230 A | 4/1992 | Kalthoff et al. | 341/166 |
| 5,225,836 A | 7/1993 | Morley, Jr. et al. | 341/150 |
| 5,241,310 A | 8/1993 | Tiemann | 341/143 |
| 5,357,251 A | 10/1994 | Morley, Jr. et al. | 341/172 |
| 5,448,644 A | 9/1995 | Pfannenmueller et al. | 381/68 |
| 5,606,296 A | 2/1997 | Seong | 332/109 |
| 5,764,100 A | * 6/1998 | Callicotte et al. | 327/554 |
| 5,907,299 A | 5/1999 | Green et al. | 341/143 |
| 5,945,874 A | * 8/1999 | Punzenberger et al. | 327/558 |
| 5,963,106 A | 10/1999 | Blyth et al. | 332/109 |
| 5,995,036 A | 11/1999 | Nise et al. | 341/172 |

FOREIGN PATENT DOCUMENTS

| | | | |
|---|---|---|---|
| DE | 44 41 996 | 5/1996 | H04R/24/00 |
| DE | 195 45 760 | 2/1997 | H04R/25/00 |
| EP | 0 534 804 | 3/1993 | H03F/3/217 |
| EP | 0 590 903 | 4/1994 | H03F/3/217 |

OTHER PUBLICATIONS

Lee et al., "Self–Calibrating 15 Bit CMOS A/D Converter", Dec. 1984, IEEE, J. Solid–State Circuits, vol. SC–19, No. 6, pp. 813, 819.

* cited by examiner

*Primary Examiner*—Howard L. Williams
(74) *Attorney, Agent, or Firm*—Thelen Bird & Priest LLP; David B. Ritchie

(57) ABSTRACT

A hybrid loop filter includes an integrator having an input and an output wherein the output forms an output of the hybrid loop filter, a plurality of transconductance amplifiers having an input and an output wherein each output of the plurality of transconductance amplifiers is coupled to the input of the integrator, a switched capacitor low pass chain having an input and a plurality of branches wherein each of the plurality of branches is coupled to the input of a separate one of said plurality of transconductance amplifiers, and a feedthrough branch having an input and an output wherein the input is coupled to the input of the switched capacitor low pass chain to form an input of said hybrid loop filter, and the output is coupled to the input of a separate one of the plurality of transconductance amplifiers.

6 Claims, 13 Drawing Sheets

HYBRID LOW-PASS SIGMA-DELTA MODULATOR

This application is a continuation of Ser. No. 09/286,261, filed Apr. 5, 1999, now U.S. Pat. No. 6,163,287.

BACKGROUND OF THE INVENTION

1. Field of the Invention

The present invention relates to techniques for analog-to-digital (A/D) conversion. More particularly, the present invention relates to techniques for A/D conversion using a delta-sigma modulator.

2. The Prior Art

Many techniques are known in the prior art for A/D conversion. Each of these A/D techniques has advantages which correspond to the application in which the A/D conversion is being performed. Choosing the A/D conversion technique to be used in a particular application can depend on the consideration of at least the speed, accuracy, cost, dynamic range and power requirements of the application. The spectrum of A/D conversion techniques available in the prior art are commonly of two types.

In the first type of A/D technique, the analog input signal is directly compared to a digital reference value. The digital value output from the A/D conversion is equal to the digital reference value which most closely compares to the analog input signal. This category of A/D converters is considered fast, however, to obtain high resolution with A/D techniques in this category is generally expensive or quite difficult. In the second type of A/D technique, the analog input is converted into a quantity that is employed to represent a digital value corresponding to the analog input signal. This second type of A/D technique includes sigma-delta modulation.

A block diagram for an A/D modulator 10 employing a sigma-delta modulation technique is depicted in FIG. 1. In the A/D modulator 10, an analog input signal is oversampled and fed into a summing junction 12 that sums the analog input with a feedback signal formed as the output of the A/D modulator 10. A common implementation of the summing junction 12 is a switched capacitor. By feeding back the output of the A/D modulator 10 into the summing junction 12, the output of the summing junction 12 is kept at a zero average signal value. The output of the summing junction 12, which represents the change in the value of the analog input signal from one sample to the next and which in summation represent a zero average signal value, is fed into an active loop filter 14.

The output of the loop filter is fed into a comparator 16 for comparison with a reference value. When the output value is above the reference value, the output of the A/D modulator 10 is a high logic value, and a high logic value is fed back to the summing junction. When the integrated value is below the reference value, the output of the A/D modulator 10 is a low logic value, and a low logic value is fed back to the summing junction 12. The high and low logic values formed as the bitstream output of the A/D modulator 10 are typically filtered at the output by a digital filter. The discussion of which is beyond the scope of this disclosure.

One of the major advantages associated with the sigma-delta modulation technique is that low resolution components can be used to process the analog input signal, and a high resolution digital output can be extracted because the A/D modulation does not depend on closely matched analog components.

Commonly the active loop filter 14 is implemented as either an active discrete-time loop filter or as a continuous-time loop filter. An example of an active discrete-time loop filter implemented as a simplified switched capacitor integrator 20 is depicted in FIG. 2A. An example of a continuous-time loop filter implemented as a transconductance integrator 40 is illustrated in FIG. 2B.

Turning now to FIG. 2A, the switched capacitor integrator 20 includes first and second switches 22 and 24, commonly implemented with an MOS transistor, an input capacitor 26, and operational amplifier 28 and a feedback capacitor 30. An input to the switched capacitor integrator 20 may be coupled to input capacitor 26 by first switch 22. A value stored on capacitor 26 can then be switched by second switch 24 to the input of an operational amplifier 28. The feedback capacitor 30 is coupled in a feedback loop between the output of the operational amplifier 28 and the input of the operational amplifier 28.

The performance by the switch capacitor integrator 20 to adequately provide high linearity and a fast settling time relies on the characteristics of the operational amplifier 28. The requirements of high linearity and a fast settling time are typically satisfied with an operational amplifier 28 having a high bandwidth that is often greater by several orders than the bandwidth of the input signal, Vin, to the A/D modulator 10. It will be appreciated by those of ordinary skill in the art, that the high bandwidth requirement of the operational amplifier 28 sets the lower boundary for the power consumption required by the A/D modulator 10.

To reduce the power consumption required by the switch capacitor integrator 20 employed in an active discrete-time loop filter approach, the switched capacitor integrator 20 of FIG. 2A is replaced by the simplified transconductance-C integrator 40 of FIG. 2B in a continuous-time loop filter approach.

Turning to FIG. 2B, the transconductance integrator 40 includes an N-channel MOS transistor 42 having a source coupled to ground, a P-channel MOS transistor 44 having a source coupled to Vdd, an operational amplifier 46 and a feedback capacitor 48. In the transconductance integrator 40, an input signal representing the output of the summing junction 12 is coupled to the gate of N-channel MOS transistor 42, and a bias voltage, Vb, is coupled to the gate of a P-channel MOS transistor 44. The drains of N-channel MOS transistor 42 and P-channel MOS transistor 44 forming a common node are coupled to an input of the operational amplifier 46. The feedback capacitor 48 is coupled in a feedback loop between the output of the operational amplifier 46 and the input of the operational amplifier 46.

Although the power consumption of the continuous-time integrator of FIG. 2B is not as great as the power consumption of the discrete-time integrator of FIG. 2A, there are nonlinearities, even in a differential implementation (a single-ended implementation is depicted in FIG. 2A), associated with the continuous-time integrator of FIG. 2B which are greater than the nonlinearities of the discrete-time integrator of FIG. 2A. These nonlinearities increase the harmonic distortion and clock jitter sensitivity of the A/D modulator 10, and degrade the dynamic range of the A/D modulator 10 by mixing the high-frequency quantization noise down to the baseband.

To avoid the problems associated with active loop filter designs typified by the active discrete-time loop filter in FIG. 2A, and the continuous-time loop filter approach of FIG. 2B, the loop filter 14 in the A/D modulator 10 has been implemented by a passive discrete-time loop filter as illustrated in FIG. 2C. The passive discrete-time loop filter of FIG. 2C is implemented as a passive switched capacitor network 50.

The passive switched capacitor network 50 includes input switches 52, 54, and 56, a switched capacitor stage 58 having switches 60, 62, 64, and 66 and capacitors 68, 70 and 72, and a phase margin stage 74 having switches 76 and 78 and capacitors 80 and 82. The input switches 52, 54, and 56 are employed to couple the voltages Vin, Vref, and—Vref, respectively, to a first plate of capacitor 68 in the switched capacitor stage 58. In the switched capacitor stage, the switches 60 and 62 are employed to couple a second plate of capacitor 68 to a ground (GND) reference potential and a first plate of capacitor 70, respectively. The switch 64 is employed to couple the first plate of capacitor 70 to a first plate of capacitor 72. The switch 66 is employed to couple the first plate of capacitor 72 to the comparator 16. The second plates of capacitors 70 and 72 are connected to GND. In the phase margin stage 74, switch 76 is employed to couple the input of the comparator to a first plate of capacitor 80, and switch 78 is employed to couple the first plate of capacitor 80 to a first plate of capacitor 82. The second plates of capacitors 80 and 82 are connected to GND.

The operation of the passive switched capacitor network 50 includes first and second steps which are repeated. In the first step, switches 52, 60, 64 and 76 are closed. As a result, in the switched capacitor stage 58, capacitor 68 is charged to the voltage Vin and the voltage on capacitor 70 is placed on capacitor 72, and in the phase margin stage 74, any charge at the input to the comparator 16 is discharged into the capacitor 80. It will be appreciated by those of ordinary skill in the art that the voltage on capacitor 72 will be essentially the same as the voltage on capacitor 70 when switch 64 is closed, because the size of capacitor 70 is commonly much greater than capacitor 72.

In the second step, either switch 54 or switch 56 is closed and switches 62, 66 and 78 are closed. As a result, in the switched capacitor stage 58, the voltage Vref is either added to or subtracted from the voltage Vin on capacitor 68 depending on whether switch 54 or switch 56 is closed, and as the first and second steps are repeated, it capacitor 70 integrates the charge on capacitor 68. Further, the voltage on capacitor 72, representing the integration of charge on capacitor 70 from the previous cycle of first and second steps, is provided to the input of the comparator 16. In the phase margin stage 74, the charge on capacitor 80 is distributed to a much larger capacitor 82.

Though the passive switch capacitor network 50 alleviates some of the problems associated with the active discrete-time loop filter 10 and the active continuous-time loop filter 30 described above, there are certain problems associated with employing a passive switched capacitor network in the A/D modulator 10. One of the disadvantages is that the use of the passive switched capacitor network requires that the comparator 16 be capable of high resolution of the signals at it inputs.

The requirement of high resolution in the comparator 16 becomes even greater as the order of the A/D modulator 10 is increased. It will be appreciated by those of ordinary skill in the art, that the order of the A/D modulator 10 depends upon the number of integrators that are cascaded in the loop filter 14. This is due to the fact that as the order of the A/D modulator increases, the output of the passive switch capacitor network 50 driving the comparator 16 drops quite rapidly. Because the drive drops, and there is no gain in the passive switch capacitor network 50, the comparator resolution 16 must be greater.

Further, although the phase margin stage 74, disclosed in an implementation of a switched capacitor network 50 by Chen et al., "A 0.25-mW Low-Pass Passive Sigma delta Modulator with Built-In Mixer for a 10-MHz IF Input", IEEE Journal of Solid State Circuits, Vol. 32, No. 6, pp. 774–782, 1998, is employed to improve the phase margin of the modulator 10, the phase margin stage 74 limits the dynamic range of the A/D modulator 10 by contributing thermal noise.

Despite the high resolution required by the switch capacitor network 50, the latency of the comparator 16, defined by the length of time it takes the comparator 16 to settle, must be kept small to maintain the stability of the A/D modulator 10. Because of the latency and resolution requirements imposed by employing a switched capacitor network 50 in the A/D modulator 10, the order of the A/D modulator is typically limited to being no greater than of second order.

BRIEF DESCRIPTION OF THE INVENTION

According to one aspect of the present invention, a hybrid loop filter includes an integrator having an input and an output wherein the output forms an output of the hybrid loop filter, a plurality of single ended transconductance amplifiers having an input and an output wherein each output of the plurality of transconductance amplifiers is coupled to the input of the integrator, a switched capacitor low pass chain having an input and a plurality of branches wherein each of the plurality of branches is coupled to the input of a separate one of said plurality of transconductance amplifiers, and a feedthrough branch having an input and an output wherein the input is coupled to the input of the switched capacitor low pass chain to form an input of said hybrid loop filter, and the output is coupled to the input of a separate one of the plurality of transconductance amplifiers.

According to another aspect of the present invention, a hybrid loop filter includes an integrator having an input and an output wherein the output forms an output of the hybrid loop filter, a plurality of differential input single ended output transconductance amplifiers having first and second inputs and an output wherein each output of the plurality of transconductance amplifiers is coupled to the input of the integrator, a first switched capacitor low pass chain having an input and a plurality of branches wherein each of the plurality of branches is coupled to the first input of a separate one of said plurality of transconductance amplifiers, a second switched capacitor low pass chain having an input and a plurality of branches wherein each of the plurality of branches is coupled to the second input of a separate one of said plurality of transconductance amplifiers, a first feedthrough branch having an input and an output wherein the input is coupled to the input of the first switched capacitor low pass chain to form a first input of said hybrid loop filter, and the output is coupled to the first input of a separate one of the plurality of transconductance amplifiers, and a second feedthrough branch having an input and an output wherein the input is coupled to the input of the second switched capacitor low pass chain to form a second input of said hybrid loop filter, and the output is coupled to the second input of a separate one of the plurality of transconductance amplifiers.

According to another aspect of the present invention, a hybrid loop filter includes an integrator having first and second inputs and first and second outputs wherein the first and second outputs forms first and second outputs of the hybrid loop filter, a plurality of differential input differential output transconductance amplifiers having first and second inputs and first and second outputs wherein each first output of the plurality of transconductance amplifiers is coupled to the first input of the integrator and each second output of the plurality of transconductance amplifiers is coupled to the second input of the integrator, a first switched capacitor low pass chain having an input and a plurality of branches wherein each of the plurality of branches is coupled to the first input of a separate one of said plurality of transconductance amplifiers, a second switched capacitor low pass chain having an input and a plurality of branches wherein each of the plurality of branches is coupled to the second input of a separate one of said plurality of transconductance amplifiers, a first feedthrough branch having an input and an output wherein the input is coupled to the first input of the first switched capacitor low pass chain to form a first input of said hybrid loop filter, and the output is coupled to the first input of a separate one of the plurality of transconductance amplifiers, and a second feedthrough branch having an input and an output wherein the input is coupled to the input of the second switched capacitor low pass chain to form a second input of said hybrid loop filter, and the output is coupled to the second input of a separate one of the plurality of transconductance amplifiers.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
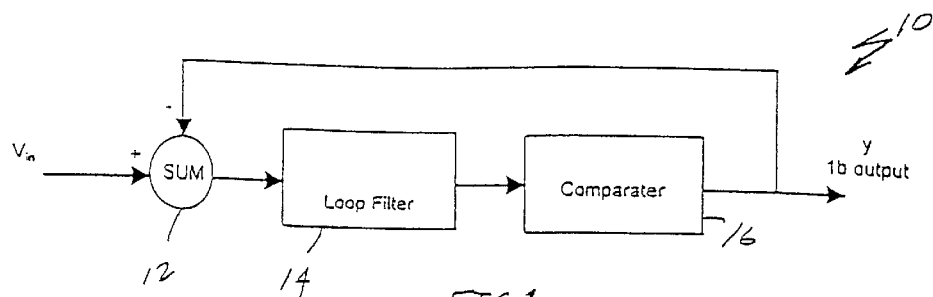
FIG. 1 is a block diagram of a sigma-delta A/D modulator having either an active or passive loop filter as is known in the art.
Figure 2A:
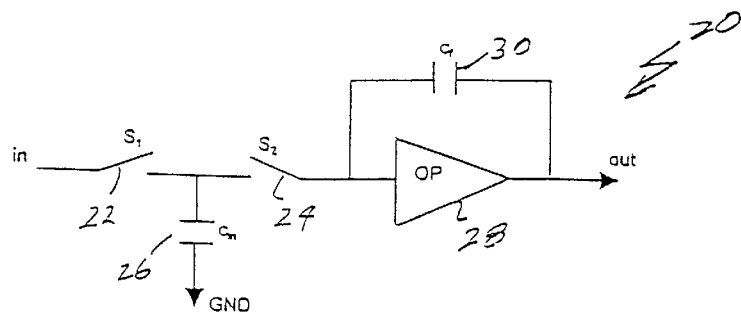
FIG. 2A is a schematic diagram of a simplified active discrete-time loop filter employed in an A/D modulator as is known in the art.
Figure 2B:
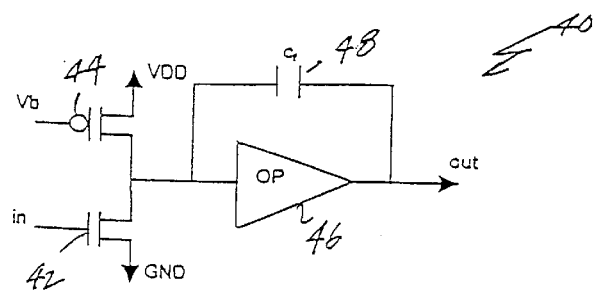
FIG. 2B is a schematic diagram of a simplified active continuous-time loop filter employed in an A/D modulator as is known in the art.
Figure 2C:
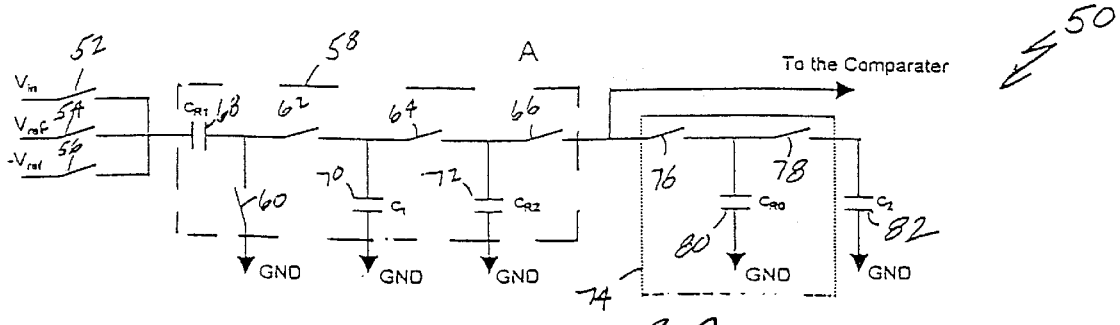
FIG. 2C is a schematic diagram of an passive discrete-time loop filter employed in an A/D modulator as is known in the art.
Figure 3:
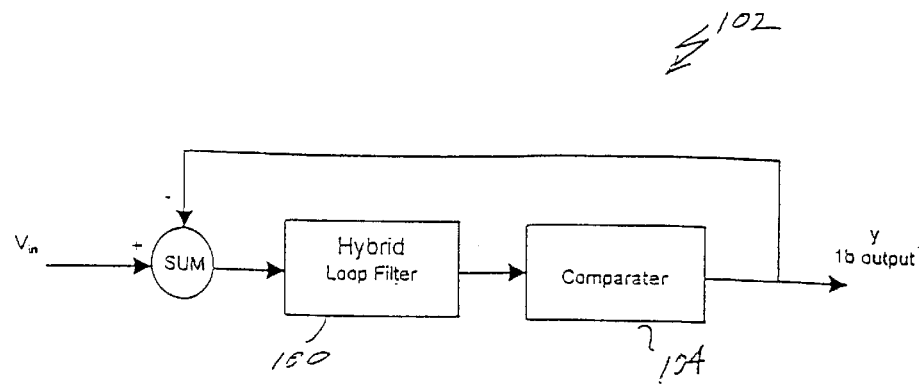
FIG. 3 is a block diagram of a sigma-delta A/D modulator having a loop filter according to the present invention.

According to the present invention, a loop filter 100 that is a hybrid of purely active and purely passive loop filter techniques is employed in a sigma-delta A/D modulator 102 as illustrated in FIG. 3. In the loop filter 100 according to the present invention, elements of a passive switched capacitor network and elements of an active continuous-time loop filter implement a loop filter 100 permits the use of a low resolution comparator 104, even when the A/D modulator order is greater than 2. An example of such a low resolution comparator is a dynamic comparator which requires no bias current. Further, in the loop filter according to the present invention, the mixing down to the baseband of distortion, quantization noise and clock jitter sensitivity as is commonly found in an active time-continuous loop filter technique is effectively reduced.

Figure 4A:
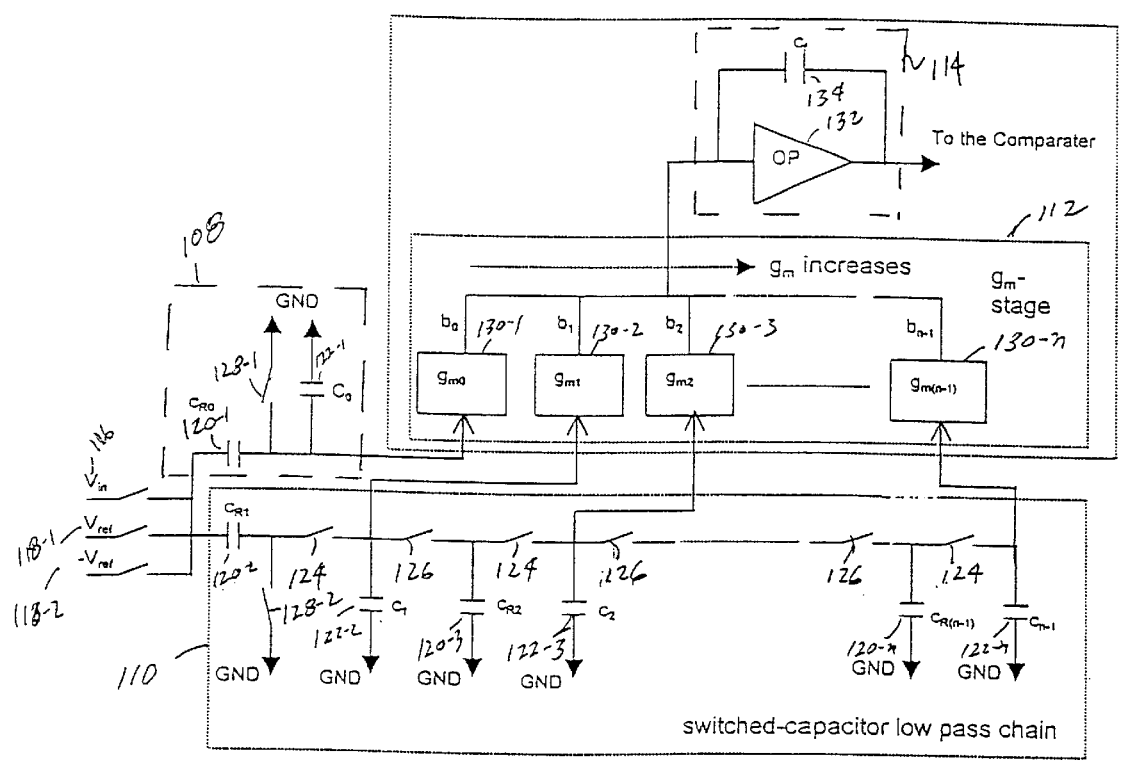
FIG. 4A is a first embodiment of a loop filter suitable for use in an A/D modulator according to the present invention.

In FIG. 4A, according to the present invention, a first embodiment of the loop filter 100-1 is illustrated that includes a feedthrough branch 108, a switched capacitor low pass chain 110 having a plurality of stages, a transconductance amplifier stage 112 having a plurality of transconductance amplifiers, and an integrator 114. In the loop filter 100-1, the feedthrough branch 108 and each of the stages in the switched capacitor low pass chain 110 is coupled to one of the plurality of transconductance amplifiers in the transconductance amplifier stage 112. Each combination of either the feedthrough branch 108 or a switched capacitor low pass chain 110 stage with a transconductance amplifier forms a branch of the loop filter 100-1.

Each of the stages in the switched capacitor low pass chain 110 and the feedthrough branch 108 includes a first capacitor 120 and a second capacitor 122. In the feedthrough branch 108 and the n–1 stages of the switched capacitor low pass chain 110, first capacitors 120-1 through 120-n and second capacitors 122-1 through 122-n are illustrated. At the input to the loop filter 100-1, the input switches 116, 118-1 and 118-2 are employed to couple the voltages Vin, Vref, and—Vref to a first plate of the first capacitors 120-1 in the feedthrough branch 108 and 120-2 in the first stage of the switched capacitor low pass chain 110. A first plate of first capacitors 120-3 through 120-n and a first plate of second capacitors 122-1 through 122-n are coupled to GND. In each of the stages the switched capacitor low pass chain 110, a second plate of each of the capacitors 120 may be coupled by a switch 124 to a second plate of each of the capacitors 122, and the second plate of each of the capacitors 120 may be coupled by a switch 126 to the second plate of each of the capacitors 122 in an adjacent stage. The second plate of capacitors 120-1 and 120-2 may also be coupled to GND by the switches 128-1 and 128-2, respectively.

Figure 5A:
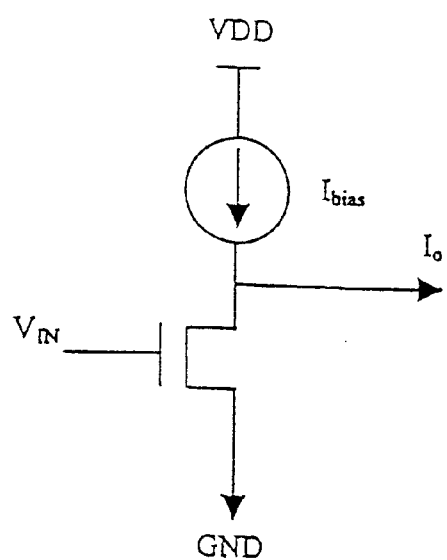
FIG. 5A illustrates an NMOS implementation of a single ended transconductance amplifier suitable for use in the loop filter depicted in FIGS. 4A–4C according to the present invention.
Figure 5B:
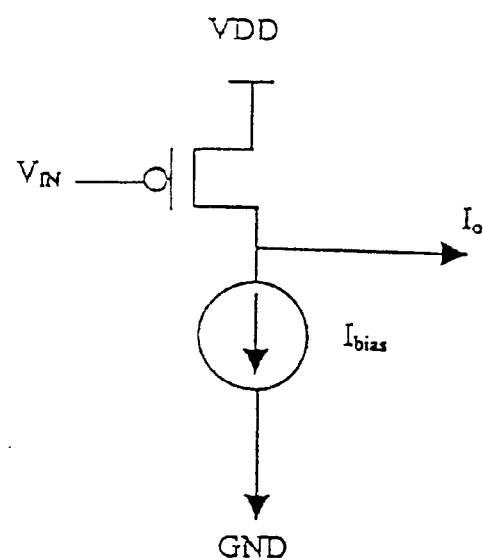
FIG. 5B illustrates a PMOS implementation of a single ended transconductance amplifier suitable for use in the loop filter depicted in FIGS. 4A–4C according to the present invention.

In each of the n–1 stages of the switched capacitor low pass chain 110 and the feedthrough branch 108, the second plate of each of the second capacitors 122-1 through 122-n is coupled to the input of a separate one of a plurality of transconductance amplifiers 130-1 through 130-n in the transconductance amplifier stage 112 to form n branches in the loop filter 100-1. The transconductance amplifiers 130-1 through 130-n are employed for the stability of the A/D modulator 102. Suitable implementations of single ended transconductance amplifiers 130 for use according to the present invention and well known to those of ordinary skill in the art are depicted in FIGS. 5A and 5B. FIG. 5A is an NMOS implementation of a single ended transconductance amplifier, and FIG. 5B is an PMOS implementation of a single ended transconductance amplifier.

In the transconductance amplifiers 130-1 through 130-n, the transconductance ($g_m$) value increases very rapidly from left to right. As an example, the ratio of the $g_{m1}/g_{m2}/g_{m3}$ between the transconductance amplifiers 130-1, 130-2 and 130-3 may be 8/300/10000 for a third-order modulator. The transconductance amplifier 130-n has the largest $g_m$ value, and the branch with the transconductance amplifier 130-n is referred to as the dominant branch. Because the switched capacitor low-pass chain 110 has unit gain in the signal bandwidth, and a large $g_m$ value provides a large gain from the input of the loop filter 100-1 to the output of the transconductance amplifier 130, the dominant branch has the largest gain.

The linearity requirement on the transconductance amplifiers 130-1 through 130-n is low, even though the transconductance amplifiers 130 coupled to the feedthrough branch 108 and the first portion of the switched capacitor low-pass chain 110 are exposed to large quantization noise, because the noise is scaled down by the lower gain in the transconductance amplifiers 130 coupled to the first portion of the switched capacitor low-pass chain 110. Further, although the noise and distortion from the dominant branch dominates, the quantization noise is largely attenuated before it reaches the input of the dominant branch of the switched capacitor low pass chain 110, because the input amplitude to the transconductance amplifier 130-n in the dominant branch is very small. Accordingly, no large distortion or clock jitter noise is likely to be generated by the dominant branch.

Figure 4B:
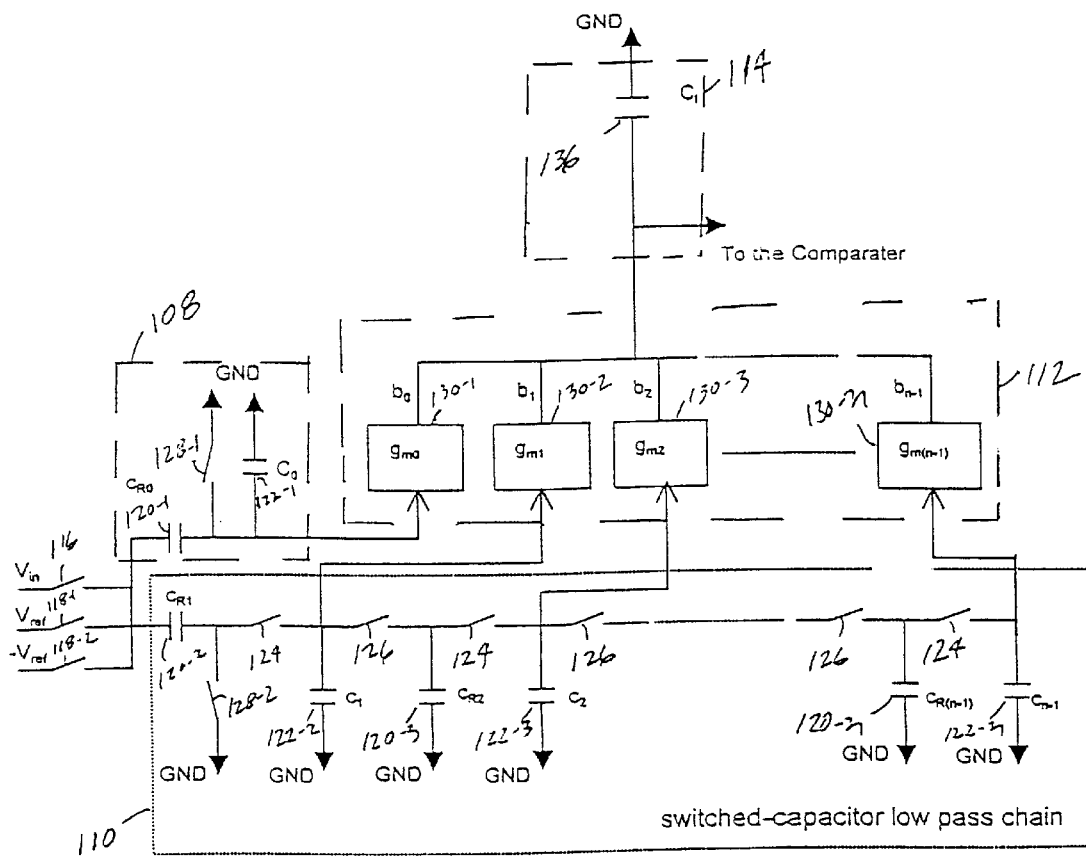
FIG. 4B is a first variation of the first embodiment of a loop filter suitable for use in an A/D modulator illustrated in FIG. 4A according to the present invention.
Figure 4C:
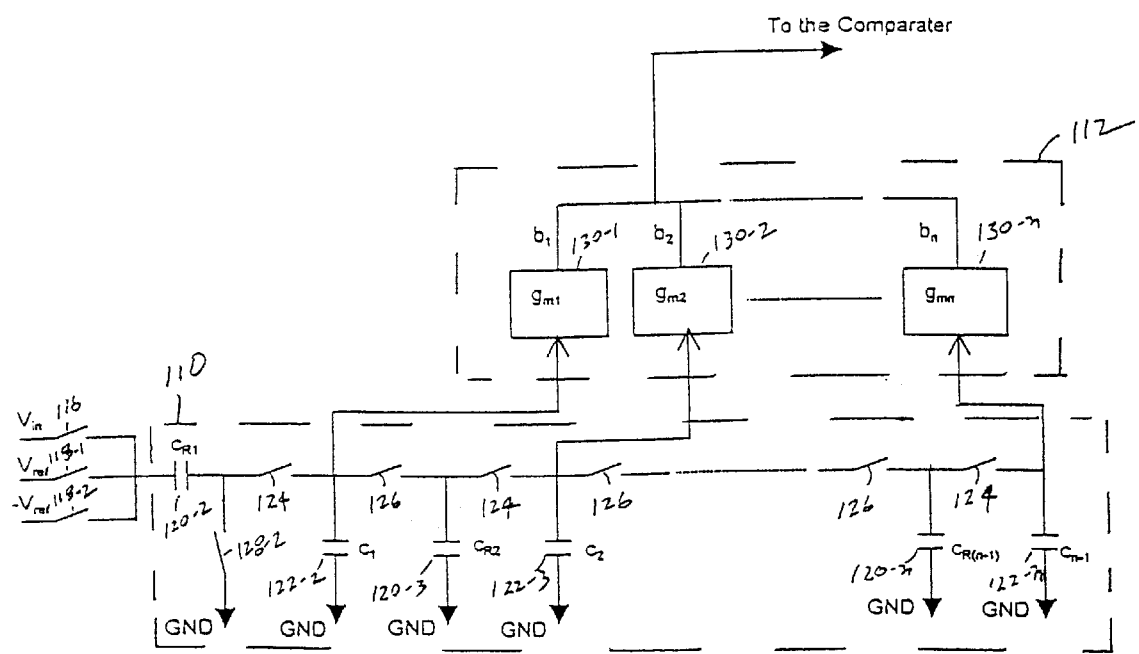
FIG. 4C is a second variation of the first embodiment of a loop filter suitable for use in an A/D modulator illustrated in FIG. 4A according to the present invention.

The outputs of the transconductance amplifiers 130-1 through 130-n are all coupled together and form the input to the integrator 114. There are various implementations of integrators known to those of ordinary skill in the art, an integrator 114 suitable for use according to the present invention includes an operational amplifier 132 having a feedback capacitor 134 coupled between the input and the output of the operational amplifier 132. The output of the operational amplifier is coupled to the input of the comparator 104. It should be appreciated that in variations of the loop filter 100-1 according to the present invention, the integrator 114 may be implemented by loading capacitor 136 having a first plate coupled to the output of the transconductance stage 112 and to the input of the comparator 104 and a second plate coupled to ground as depicted in FIG. 4B. Otherwise, the integrator 114 may be omitted as depicted in FIG. 4C. It should be observed that when the integrator 114 is omitted, the feedthrough branch 108 is not included because all of the branches associated with the switched capacitor low pass chain 110 have been integrated.

One requirement of the integrator 114 is to absorb the error current from the transconductance stage 112 and to provide charging current to the input capacitance of the comparator 104. When the input capacitance of the comparator 104 is small and the error current from the transconductance stage 112 in a normal operation condition is also small, the bias current of the integrator 114 may also be set to a small value without violating the performance requirements of the integrator 114. The input referred distortion and noise from the integrator 114 following the transconductance stage 112 will be scaled down by the gain of the transconductance stage 112. The problems, such as, large distortion and quantization noise mixing down to the base band, associated with the continuous-time active approach are prevented.

The operation of the feedthrough branch 108 and the switched capacitor low pass chain 110 includes first and second steps which are repeated. In the first step, switches 116, 126, and 128 are closed. As a result, capacitors 120-1 and 120-2 are charged to the voltage Vin and the voltages on capacitors 122-2 through 122-(n–1) are placed on capacitors 120-3 through 120-n, respectively. It will be appreciated by those of ordinary skill in the art that when the switches 126 are closed, the voltages on capacitors 122-2 through 122-(n–1) are placed on capacitors 120-3 through 120-n, respectively, because the relative sizes of capacitors 122-2 through 122-(n–1) to capacitors 120-3 through 120-n, respectively, are greater.

In the second step, either switch 118-1 or switch 118-2 is closed and switches 124 are closed. As a result, in the feedthrough branch 108 and the switched capacitor low pass chain 110, the voltage Vref is either added to or subtracted from the voltage Vin on capacitors 120-1 and 120-2 depending on whether switch 118-1 or switch 118-2 is closed. This value is also placed on capacitor 122-1 and 122-2. As the first and second steps are repeated, capacitors 122-2 through 122-n integrate the charge on capacitors 120-2 through 120-n, respectively. The voltage on the capacitors 122-1 through 122-n is provided to the inputs of the transconductance amplifiers 130-1 through 130-n, respectively.

It should be appreciated that in the loop filter 100-1, because the bias currents of the transconductance amplifiers 130 -1 through 130-(n–1) and the integrator 114 are small compared to the bias current of the transconductance amplifier 130-n in the dominant branch, the current consumption is low. Further, the current needed to reach the required $g_m$ value in the non-dominant branches is negligible compared to that of the dominant branch. The thermal noises from the other branches and the continuous-time integrators are scaled down by the gain of the dominant branch, the thermal noise of the dominant branch dominates. The concentration of the current to the dominant branch helps to reduce the thermal noise and increase the dynamic range of the modulator.

Figure 6A:
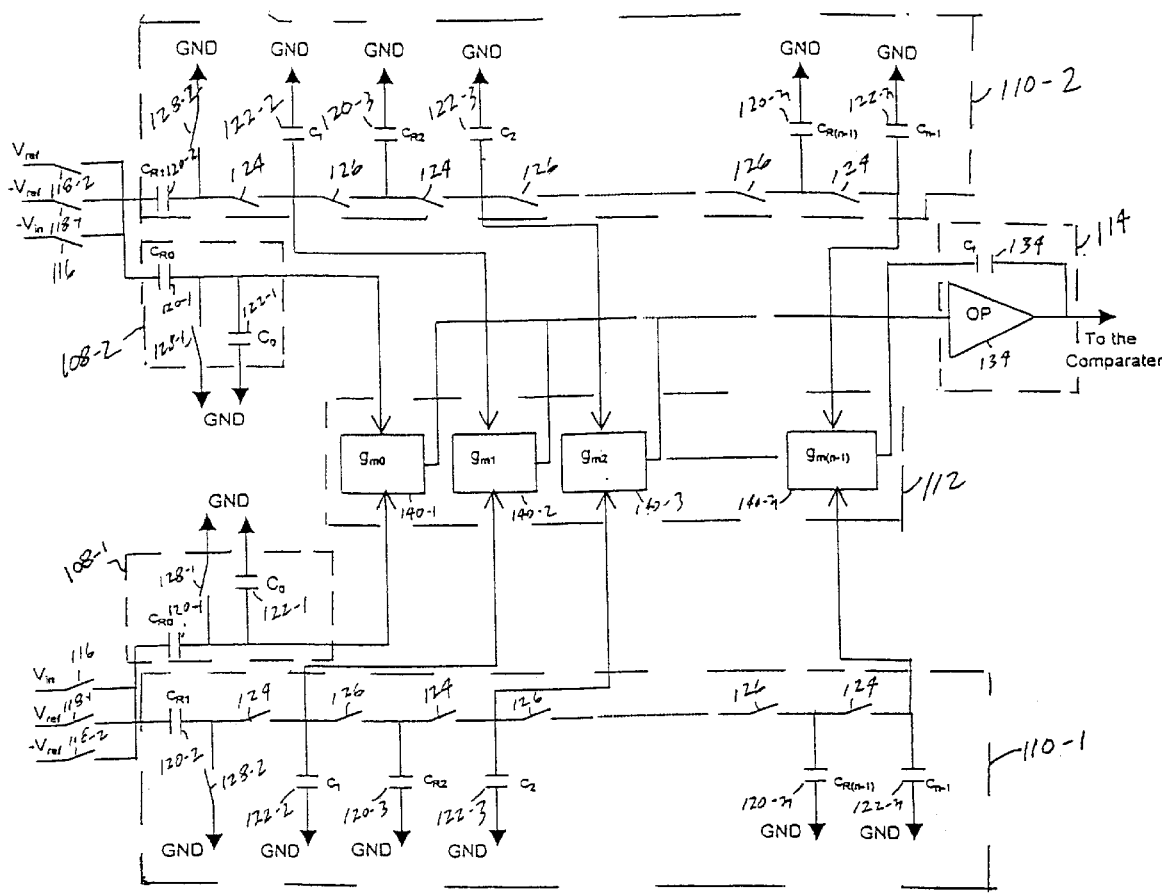
FIG. 6A is a second embodiment of a loop filter suitable for use in an A/D modulator according to the present invention.

In FIG. 6A, a second embodiment of a loop filter 100-2 according to the present invention is illustrated. The loop filter 100-2 is similar to the loop filter 100-1, except that the transconductance amplifiers 140-1 through 140-n in the transconductance stage of loop filter 100-2 are differential input single ended output MOS transconductance amplifiers instead of the single ended MOS transconductance amplifiers 130-1 through 130-n in the transconductance stage of loop filter 100-1. Accordingly, first and second feedthrough branches 108-1 and 108-2 and first and second switched capacitor low pass chains 110-1 and 110-2 that are similar to the feedthrough branch 108 and the switched capacitor low pass chain 110 in loop filter 100-1 are coupled to the inputs of the differential input single ended output MOS transconductance amplifiers 140 of loop filter 100-2.

Figure 7A:
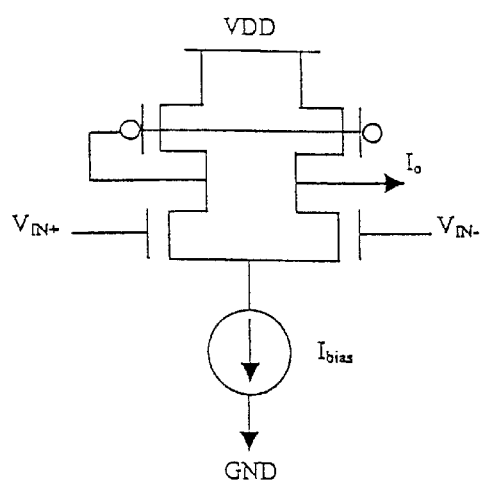
FIG. 7A illustrates an NMOS implementation of a differential input single ended output transconductance amplifier suitable for use in the loop filter depicted in FIGS. 6A–6C according to the present invention.
Figure 7B:
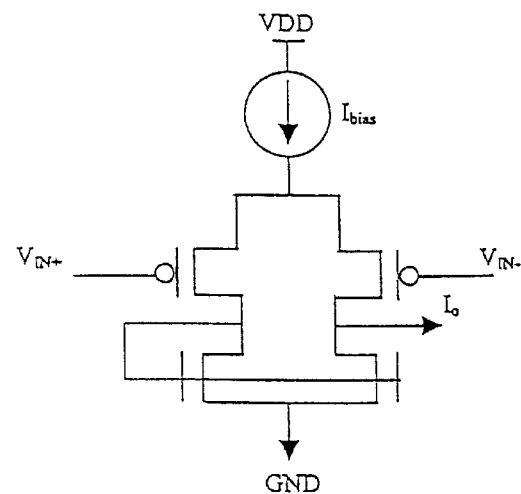
FIG. 7B illustrates a PMOS implementation of a differential input single ended output transconductance amplifier suitable for use in the loop filter depicted in FIGS. 6A–6C according to the present invention.

Implementations of differential input single ended output transconductance amplifiers 140 suitable for use according to the present invention and well known to those of ordinary skill in the art are depicted in FIGS. 7A and 7B. FIG. 7A is an NMOS go implementation of a differential input single ended output transconductance amplifier, and FIG. 7B is an PMOS implementation of a differential input single ended output transconductance amplifier.

Figure 6B:
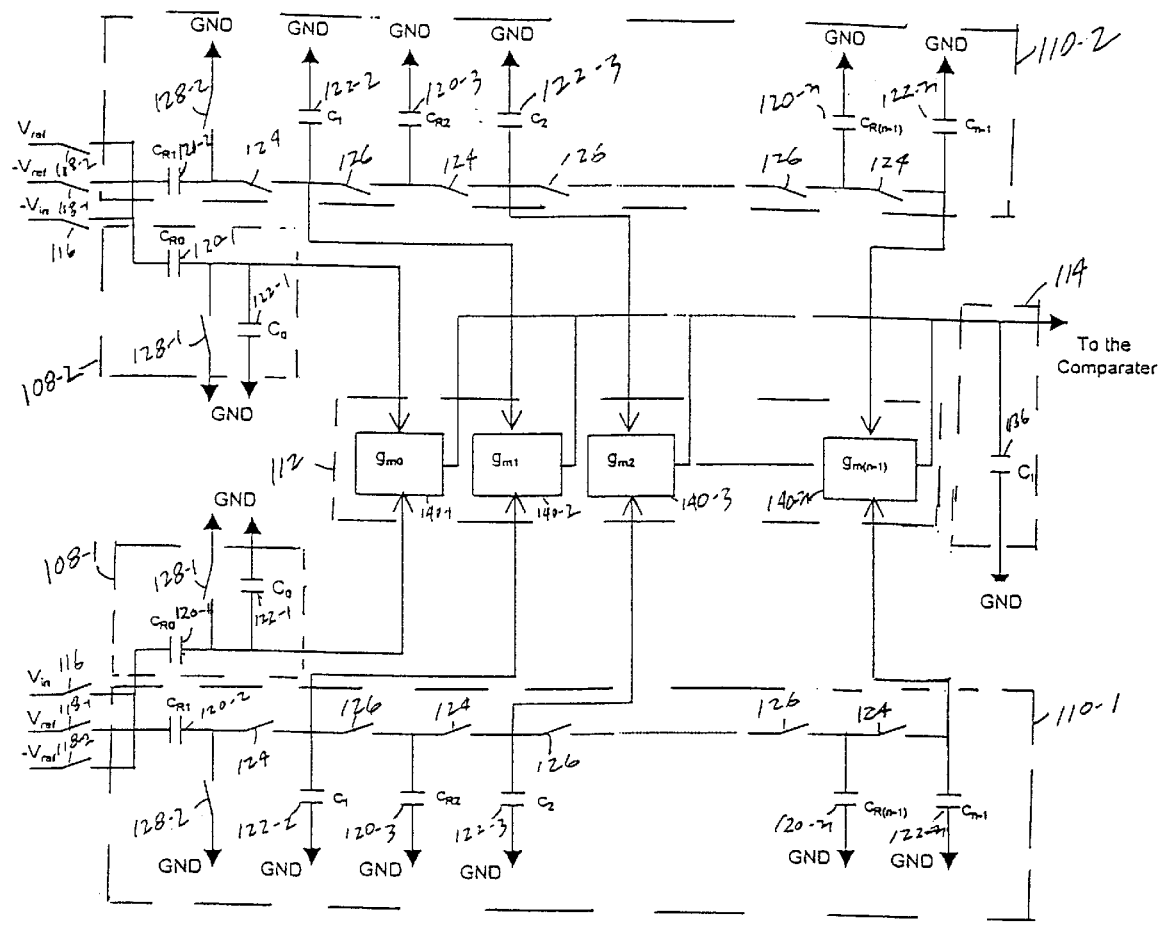
FIG. 6B is a first variation of the second embodiment of a loop filter suitable for use in an A/D modulator illustrated in FIG. 6A according to the present invention.
Figure 6C:
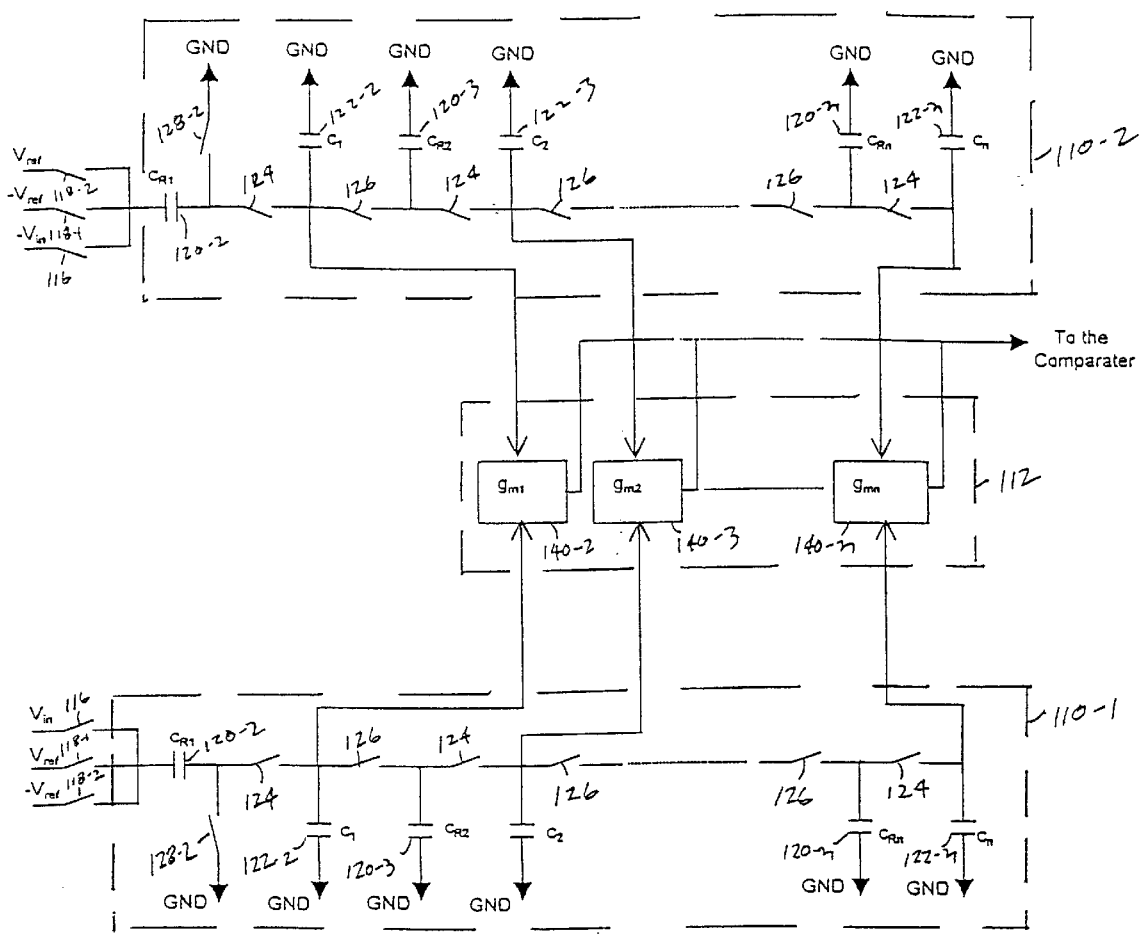
FIG. 6C is a second variation of the second embodiment of a loop filter suitable for use in an A/D modulator illustrated in FIG. 6A according to the present invention.

It should be appreciated that like the variations of the loop filter 100-1 according to the present invention, the integrator 114 in loop filter 100-2 may be implemented by a loading capacitor 136 having a first plate coupled to the output of the transconductance stage 112 and to the input of the comparator 104 and a second plate coupled to ground as depicted in FIG. 6B. Otherwise, the integrator 114 may be omitted as depicted in FIG. 6C. It should be observed that when the integrator 114 is omitted, the feedthrough branches 108-1 and 108-2 are not included because all of the branches associated with the switched capacitor low pass chains 110-1 and 110-2 have been integrated.

Figure 8A:
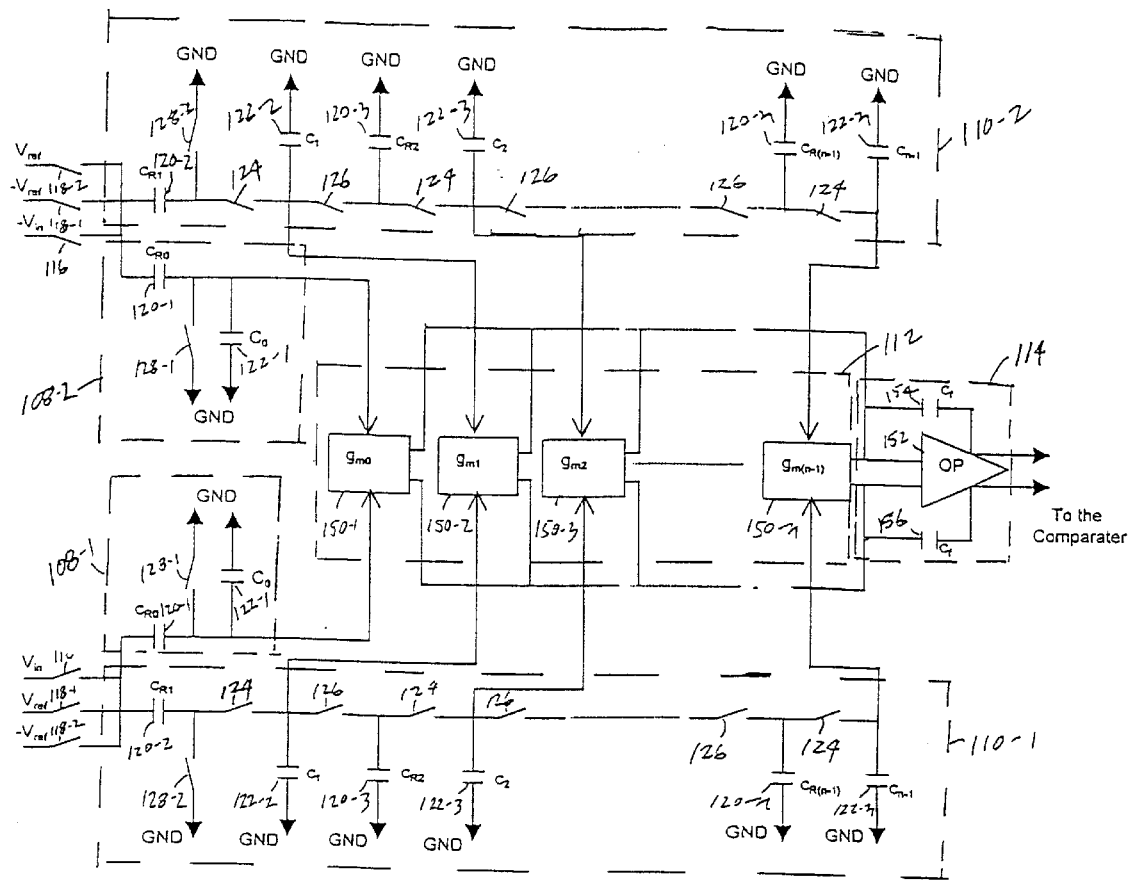
FIG. 8A is a third embodiment of a loop filter suitable for use in an A/D modulator according to the present invention.

In FIG. 8A, a third embodiment of a loop filter 100-3 according to the present invention is illustrated. The loop filter 100-3 is similar to the loop filters 100-1 and 110-2, except that the transconductance amplifiers 150-1 through 150-n in the transconductance stage of loop filter 100-3 are differential input differential output MOS transconductance amplifiers instead of the single ended MOS transconductance amplifiers 130-1 through 130-n in the transconductance stage of loop filter 100-1 and the differential input single ended output MOS transconductance amplifiers 140-1 through 140-n in the transconductance stage of loop filter 100-2.

Accordingly, first and second feedthrough branches 108-1 and 108-2 and first and second switched capacitor low pass chains 110-1 and 110-2 similar to the feedthrough branch 108 and the switched capacitor low pass chain 110 in loop filter 100-1 are coupled to the inputs of the differential input differential output MOS transconductance amplifiers 150 of loop filter 100-3, and integrator 114, unlike, the integrators in loop filters 100-1 and 110-2 includes a differential input differential output op-amp 152 and first and second feedback capacitors 154 and 156 coupled between the inputs and outputs of the op-amp.

Figure 9A:
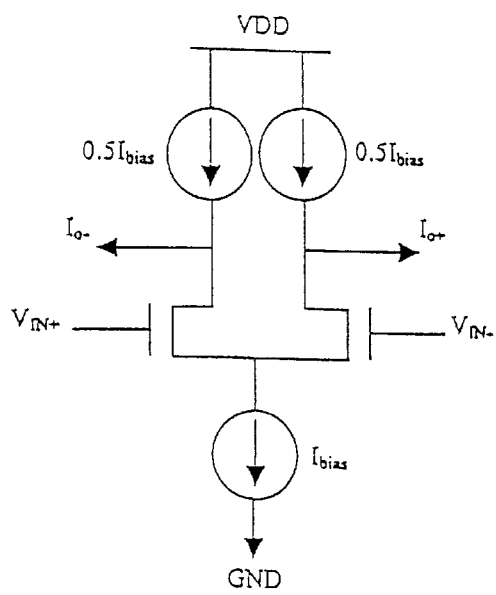
FIG. 9A illustrates an NMOS implementation of a differential input differential output transconductance amplifier suitable for use in the loop filter depicted in FIGS. 8A–8C according to the present invention.
Figure 9B:
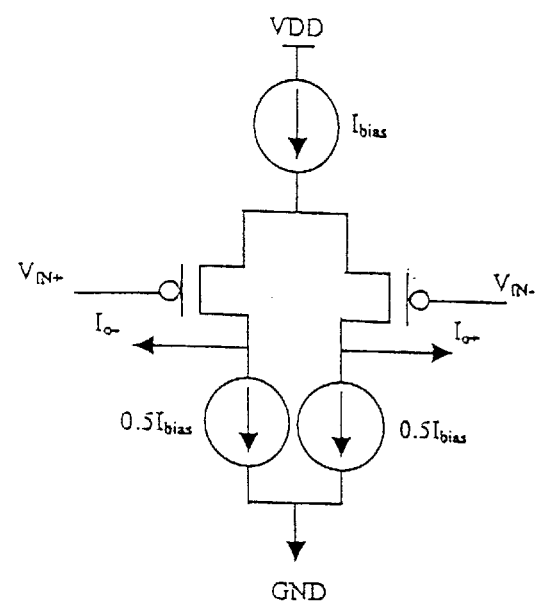
FIG. 9B illustrates a PMOS implementation of a differential input differential output transconductance amplifier suitable for use in the loop filters depicted in FIGS. 8A–8C according to the present invention.

Implementations of differential input differential output transconductance amplifiers 150 suitable for use according to the present invention and well known to those of ordinary skill in the art are depicted in FIGS. 9A and 9B. FIG. 9A is an NMOS implementation of a differential input differential output transconductance amplifier, and FIG. 9B is an PMOS implementation of a differential input differential output transconductance amplifier.

Figure 8B:
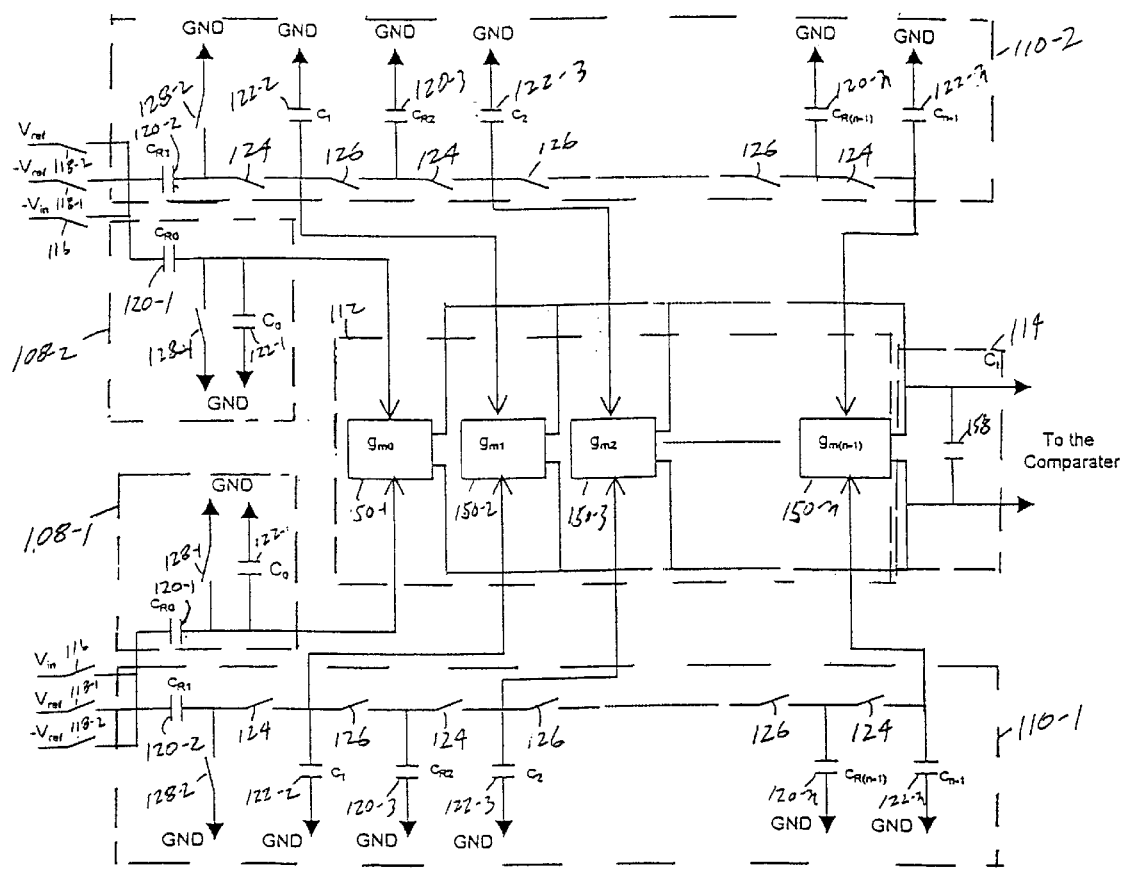
FIG. 8B is a first variation of the third embodiment of a loop filter suitable for use in an A/D modulator illustrated in FIG. 8A according to the present invention.
Figure 8C:
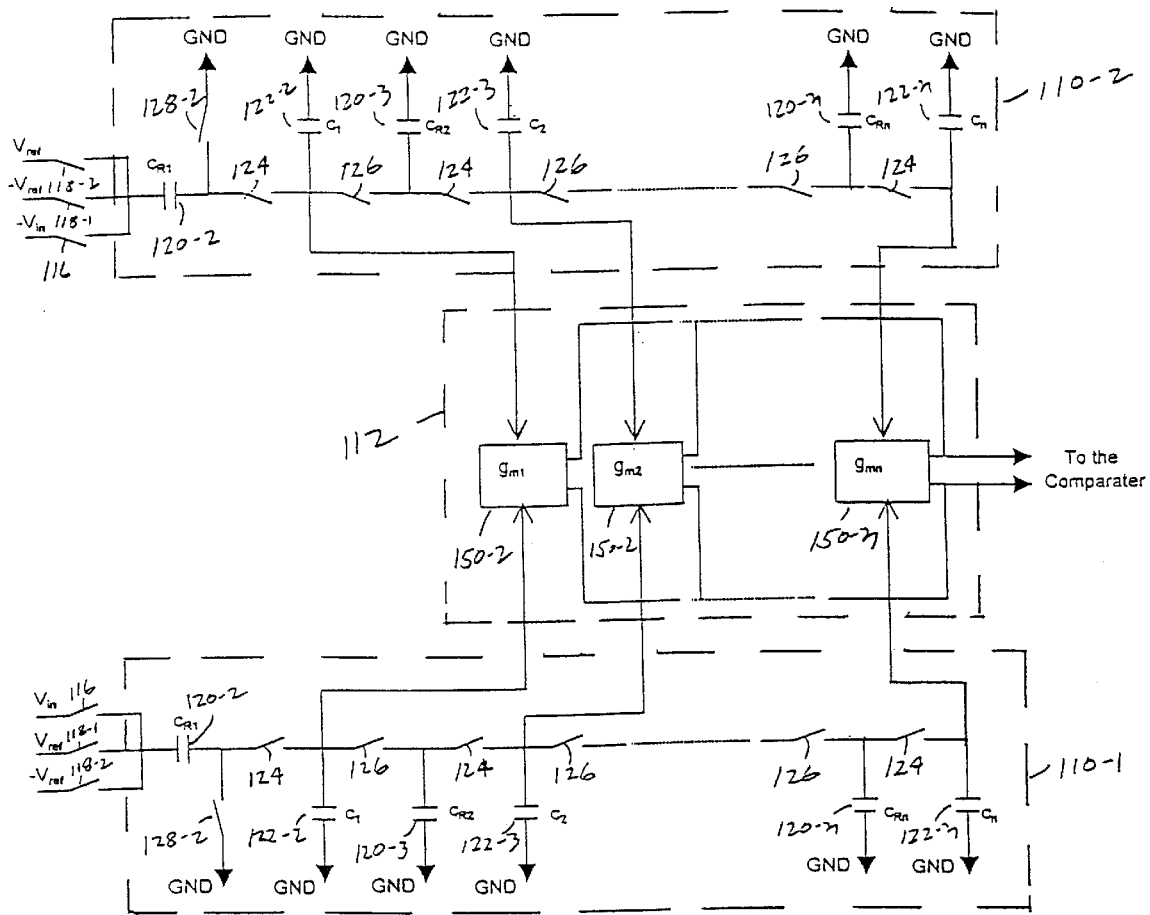
FIG. 8C is a second variation of the third embodiment of a loop filter suitable for use in an A/D modulator illustrated in FIG. 8A according to the present invention.

It should be appreciated that in variations of the loop filter 100-3 according to the present invention, the integrator 114 may be implemented by a loading capacitor 158 coupled between the outputs of the transconductance stage 112 as depicted in FIG. 8B. Otherwise, the integrator 114 may be omitted. It should be observed that when the integrator 114 is omitted, the feedthrough branches 108-1 and 108-2 are not included because all of the branches associated with the switched capacitor low pass chains 110-1 and 110-2 have been integrated.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A hybrid loop filter comprising:

means for integrating a signal, said means for integrating having an input and an output, said output forming an output of said hybrid loop filter;

means for amplifying said signal, each of said means for amplifying having an input and an output, each output of said means for amplifying coupled to said input of said means for integrating;

means for switching a capacitor low pass chain having an input and a plurality of branches, each of said plurality of branches coupled to said input of a separate one of said means for amplifying; and means for feeding through said signal, said means for feeding through having an input and an output, said input coupled to said input of said means for switching to form an input of said hybrid loop filter, and said output coupled to said input of a separate one of said means for amplifying.

2. A hybrid loop filter comprising:

means for amplifying a signal, each of said means for amplifying having an input and an output, each output of said means for amplifying coupled together to form an output of said hybrid loop filter; and means for switching a capacitor low pass chain, said means for switching having an input and a plurality of branches, said input forming an input of said hybrid loop filter, and each of said plurality of branches coupled to said input of a separate one of said means for amplifying.

3. A hybrid loop filter comprising:

means for integrating a signal, said means for integrating having an input and an output, said output forming an output of said hybrid loop filter;

means for amplifying said signal, each of said means for amplifying having a first input, a second input and an output, each output of said means for amplifying coupled to said input of said means for integrating;

a first means for switching a capacitor low pass chain, said first means for switching having an input and a plurality of branches, each of said plurality of branches coupled to said first input of a separate one of said means for amplifying;

a second means for switching said capacitor low pass chain, said second means for switching having an input and a plurality of branches, each of said plurality of branches coupled to said second input of a separate one of said means for amplifying;

a first means for feeding through said signal, said first means for feeding through having an input and an output, said input coupled to said input of said first means for switching to form a first input of said hybrid loop filter, and said output coupled to said first input of a separate one of said means for amplifying; and a second means for feeding through said signal, said second means for feeding through having an input and an output, said input coupled to said input of said second means for switching to form a second input of said hybrid loop filter, and said output coupled to said second input of a separate one of said means for amplifying.

4. A hybrid loop filter comprising:

means for amplifying a signal, each of said means for amplifying having a first input, a second input and an output, each output of said means for amplifying coupled together to form an output of said hybrid loop filter;

a first means for switching a capacitor low pass chain having an input and a plurality of branches, said input forming a first input of said hybrid loop filter, and each of said plurality of branches coupled to said first input of a separate one of said means for amplifying; and a second means for switching a capacitor low pass chain having an input and a plurality of branches, said input forming a second input of said hybrid loop filter, and each of said plurality of branches coupled to said second input of a separate one of said means for amplifying.

5. A hybrid loop filter:

means for integrating a signal, said means for integrating having a first input, a second input, a first output and a second output, said first output forming a first output of said hybrid loop filter and said second output forming a second output of said hybrid loop filter;

means for amplifying said signal, each of said means for amplifying having a first input, a second input, a first output and a second output, each first output of said means for amplifying coupled to said first input of said means for integrating, and each second output of said means for amplifying coupled to said second input of said means for integrating;

a first means for switching a capacitor low pass chain having an input and a plurality of branches, each of said plurality of branches coupled to said first input of a separate on of said means for amplifying;

a second means for switching a capacitor low pass chain having an input and a plurality of branches, each of said plurality of branches coupled to said second input of a separate one of said means for amplifying;

a first means for feeding through said signal, said first means for feeding through having an input and an output, said input coupled to said input of said first means for feeding through to form a first input of said hybrid loop filter, and said output coupled to said first input of a separate one of said means for amplifying; and a second means for feeding through said signal, said second means for feeding through having an input and an output, said input coupled to said input of said second means for feeding through to form a second input of said hybrid loop filter, and said output coupled to said second input of a separate one of said means for amplifying.

6. A hybrid loop filter comprising:

means for amplifying a signal, each of said means for amplifying having a first input, a second input, a first output, and a second output, each first output of said means for amplifying coupled together to form a first output of said hybrid loop filter, and each second output of said means for amplifying coupled together to form a second output of said hybrid loop filter;

a first means for switching a capacitor low pass chain having an input and a plurality of branches, said input forming a second input of said hybrid loop filter, and each of said plurality of branches coupled to said second input of a separate one of said means for amplifying; and a second means for switching a capacitor low pass chain having an input and a plurality of branches, said input forming a second input of said hybrid loop filter, and each of said plurality of branches coupled to said second input of a separate one of said means for amplifying.

* * * * *

UNITED STATES PATENT AND TRADEMARK OFFICE
CERTIFICATE OF CORRECTION

PATENT NO. : 6,466,146 B1
DATED : October 15, 2002
INVENTOR(S) : Renyuan Huang

It is certified that error appears in the above-identified patent and that said Letters Patent is hereby corrected as shown below:

Column 3,
Line 41, replace "as the first and second steps are repeated, it capacitor" with -- as the first and second steps are repeated, capacitor --

Column 9,
Line 18, replace "an NMOS go implementation of a differential input single" with -- an NMOS implementation of a differential input single --

Signed and Sealed this

Twenty-sixth Day of August, 2003

JAMES E. ROGAN
*Director of the United States Patent and Trademark Office*